(12) United States Patent
So et al.

(10) Patent No.: US 9,548,341 B2
(45) Date of Patent: Jan. 17, 2017

(54) ORGANIC LIGHT EMITTING DIODE DISPLAY

(71) Applicant: SAMSUNG DISPLAY CO., LTD., Yongin, Gyeonggi-do (KR)

(72) Inventors: Dong-Yoon So, Yongin (KR); Ji-Eun Kim, Yongin (KR); Han-Soo Kim, Yongin (KR); Young-Jun Chung, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/257,359

(22) Filed: Apr. 21, 2014

(65) Prior Publication Data

US 2015/0048322 A1 Feb. 19, 2015

(30) Foreign Application Priority Data

Aug. 14, 2013 (KR) ........................ 10-2013-0096837

(51) Int. Cl.
*H01L 27/32* (2006.01)
*H01L 51/52* (2006.01)

(52) U.S. Cl.
CPC ....... *H01L 27/3246* (2013.01); *H01L 27/3276* (2013.01); *H01L 27/326* (2013.01); *H01L 27/3216* (2013.01); *H01L 27/3218* (2013.01); *H01L 51/5203* (2013.01); *H01L 2227/323* (2013.01)

(58) Field of Classification Search
CPC ............. H01L 27/3246; H01L 27/3218; H01L 51/5203

USPC .... 257/40, 483, E21.158, E51.022; 313/504, 313/505, 506, 509; 345/204, 600, 76, 82, 85

See application file for complete search history.

(56) References Cited

U.S. PATENT DOCUMENTS

2009/0146929 A1* 6/2009 Kim .................... H01L 51/5278 345/77
2011/0043096 A1* 2/2011 Asaki .................. H01L 27/3211 313/483

FOREIGN PATENT DOCUMENTS

| KR | 1020040025449 | 3/2004 |
| KR | 1020110058407 | 6/2011 |
| KR | 1020120015675 | 2/2012 |

* cited by examiner

*Primary Examiner* — David Vu
*Assistant Examiner* — Mouloucoulaye Inoussa
(74) *Attorney, Agent, or Firm* — F. Chau & Associates, LLC

(57) ABSTRACT

OLED display that includes: a substrate; a plurality of thin film transistors formed on the substrate; a plurality of first electrodes respectively connected to the thin film transistors; a pixel definition layer formed on the substrate and having a first opening, a second opening, and a third opening respectively exposing first, second, and third first electrodes of the plurality of first electrodes; an emission layer formed at the first opening, the second opening, and the third opening; and a second electrode formed on the emission layer, wherein the first opening has a first pair of boundary lines facing each other and a second pair of boundary lines facing each other, and the first pair of boundary lines overlap boundary lines of a pair of boundary lines of the first first electrode or are positioned outside the boundary lines of the pair of boundary lines of the first first electrode.

17 Claims, 11 Drawing Sheets

ORGANIC LIGHT EMITTING DIODE DISPLAY

CROSS-REFERENCE TO RELATED APPLICATION

This application claims priority under 35 U.S.C. §119 to Korean Patent Application No. 10-2013-0096837 filed in the Korean Intellectual Property Office on Aug. 14, 2013, the disclosure of which is incorporated by reference herein in its entirety.

TECHNICAL FIELD

The present invention relates to an organic light emitting diode (OLED) display.

DISCUSSION OF RELATED ART

An OLED display includes two electrodes and an organic emission layer interposed therebetween. One electrode may be a cathode and the other may be an anode. Electrons injected from the cathode and holes injected from the anode are bonded to each other in the organic emission layer to form excitons, and while the excitons discharge energy, light is emitted.

The OLED display includes a plurality of pixels each including an OLED that is formed of a cathode, an anode, and an organic emission layer. A plurality of transistors and capacitors for driving the OLED are formed in each pixel. The plurality of transistors include a switching transistor and a driving transistor.

Among the transistors, the organic emission layer may be deposited and formed by using a fine metal mask (FMM), and in this case, an open region of the mask and a region where the organic emission layer is to be formed are aligned with each other. However, a misalignment may occur while the mask is moved.

If the misalignment occurs, the region corresponding to the organic emission layer is reduced or a wrong color is deposited such that color mixing occurs, for example.

SUMMARY

An organic light emitting diode (OLED) display according to an exemplary embodiment of the present invention includes: a substrate; a plurality of thin film transistors formed on the substrate; a plurality of first electrodes respectively connected to the thin film transistors; a pixel definition layer formed on the substrate and having a first opening, a second opening, and a third opening respectively exposing first, second, and third first electrodes of the plurality of first electrodes; an emission layer formed at the first opening, the second opening, and the third opening; and a second electrode formed on the emission layer, wherein the first opening has a first pair of boundary lines facing each other and a second pair of boundary lines facing each other, and the first pair of boundary lines overlap boundary lines of a pair of boundary lines of the first first electrode or are positioned outside the boundary lines of the pair of boundary lines of the first first electrode.

The second pair of boundary lines of the first opening may be positioned apart from another pair of boundary lines of the first first electrode by at least 4 μm.

Boundary lines of the second and third openings may be respectively positioned within boundary lines of the second and third first electrodes.

The boundary lines of the second and third openings may be positioned apart from the boundary lines of the second and third first electrodes by at least 4 μm.

The emission layer may include a first emission layer, a second emission layer, and a third emission layer respectively positioned on the first, second, and third electrodes, and the first emission layer, the second emission layer, and the third emission layer are respectively positioned in the first, second, and third openings.

The first emission layer, the second emission layer, and the third emission layer may emit light of different colors.

The first emission layer, the second emission layer, and the third emission layer may be a blue emission layer, a red emission layer, and a green emission layer, respectively.

A plurality of the first, second and third emission layers may form columns and rows, and the columns may include a first column formed of the first emission layers and a second column formed of the second emission layers and the third emission layers.

The first column and the second column may be alternately repeated, and the second emission layer and the third emission layer may be alternately positioned in the second column.

An OLED display according to an exemplary embodiment of the present invention includes: a substrate; a plurality of thin film transistors formed on the substrate; a plurality of first electrodes respectively connected to the thin film transistors; a pixel definition layer formed on the substrate and having a first opening, a second opening, and a third opening respectively exposing first, second, and third first electrodes of the plurality of first electrodes; an emission layer formed in the first opening, the second opening, and the third opening; and a second electrode formed on the emission layer, wherein the first opening exposes at least one side of the first first electrode, and the second and third openings respectively have a boundary entirely positioned within the boundary of the second and third first electrodes.

The emission layer may include a first emission layer, a second emission layer, and a third emission layer for emitting different colors, wherein the first emission layer, the second emission layer, and the third emission layer may be respectively positioned in the first, second, and third openings.

The first emission layer, the second emission layer, and the third emission layer may be a blue emission layer, a red emission layer, and a green emission layer, respectively.

A plurality of the first, second and third emission layers may form columns and rows, and the columns may include a first column formed of the first emission layers, and a second column formed of the second emission layers and the third emission layers.

The first column and the second column may be alternately repeated, and the second emission layer and the third emission layer may be alternately positioned in the second column.

An OLED display according to an exemplary embodiment of the present invention includes: a substrate; a plurality of pixel electrodes formed on the substrate; and a pixel definition layer having a plurality of openings exposing the pixel electrodes, wherein a first opening of the pixel definition layer exposes at least one side of a first pixel electrode of the pixel electrodes or overlaps at least one side of the first pixel electrode.

A second opening of the pixel definition layer may be surrounded by a second pixel electrode of the pixel electrodes and a third opening of the pixel definition layer may be surrounded by a third pixel electrode of the pixel electrodes.

The first opening may expose at least one side of a fourth pixel electrode of the pixel electrodes.

The first and fourth pixel electrodes may be disposed in the same column.

DETAILED DESCRIPTION OF THE EMBODIMENTS

Figure 1:
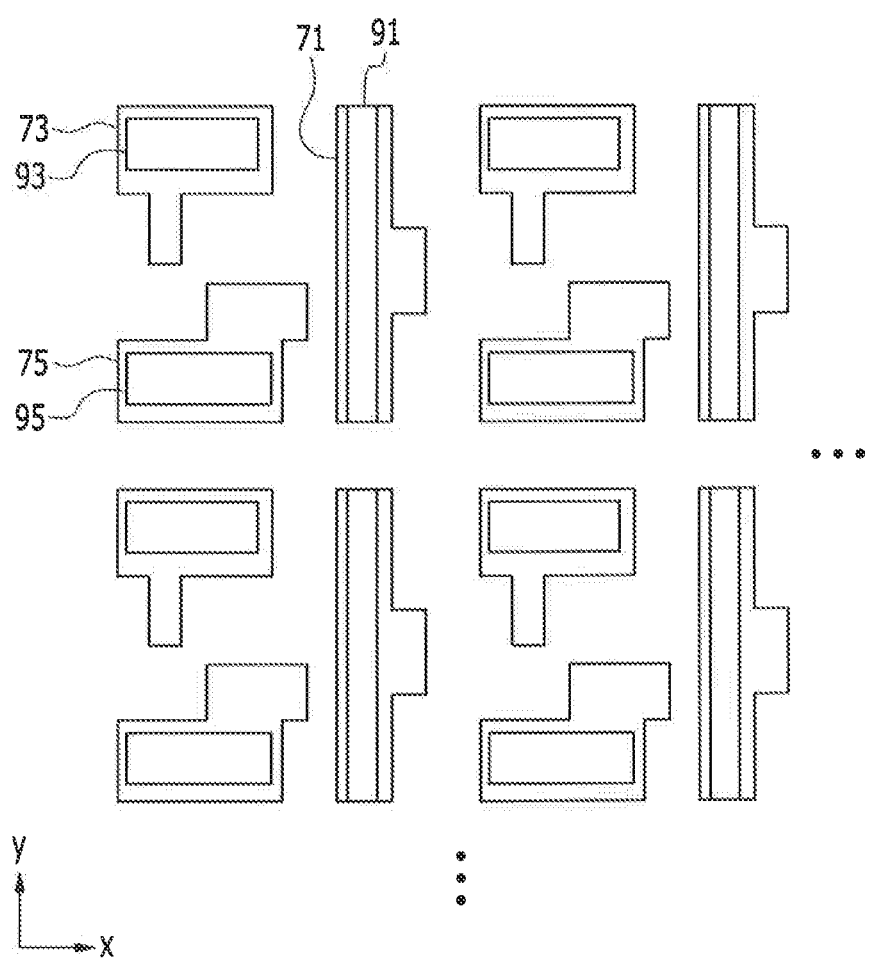
FIG. 1 is a layout view of a pixel of an organic light emitting diode (OLED) display according to an exemplary embodiment of the present invention.

Exemplary embodiments of the present invention will be described more fully hereinafter with reference to the accompanying drawings. However, the described embodiments may be modified in various different ways and should not be construed as limited to the embodiments disclosed herein.

Like reference numerals may designate like elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Now, an organic light emitting diode (OLED) display according to an exemplary embodiment of the present invention will be described with reference to accompanying drawings.

FIG. 1 is a layout view of a pixel of an OLED display according to an exemplary embodiment of the present invention.

As shown in FIG. 1, an OLED display according to an exemplary embodiment of the present invention includes a plurality of pixels. Each pixel includes a thin film transistor (not shown) and an organic light emitting element (not shown) connected to the thin film transistor.

The organic light emitting elements of each pixel include first, second, and third first electrodes 71, 73, and 75 as anodes, an organic emission layer, and a second electrode as a cathode. A pixel definition layer having openings 91, 93, and 95 exposing the first, second, and third first electrodes 71, 73, and 75 may be formed around the first electrodes, and the organic emission layer is formed in the openings 91, 93, and 95.

Each pixel may be one among red, green, and blue pixels, and the red pixel includes a red organic emission layer while the green pixel includes a green organic emission layer. The blue pixel includes a blue organic emission layer, and the blue organic emission layer is formed on the entirety of a substrate such that it may also be formed in the red pixel and the green pixel.

If the openings formed in each of the blue, red, and green pixels are respectively referred to as first openings 91, second openings 93, and third openings 95, the second openings 93 and the third openings 95 are alternately disposed in a y-axis direction to form a second pixel column, and the first openings 91 are continuously disposed in the y-axis direction with a predetermined interval therebetween to form a first pixel column. The second pixel column formed by the second openings 93 and the third openings 95 and the first pixel column formed by the first openings 91 are alternately disposed in the x-axis direction.

Each of the second openings 93 and the third openings 95 may be formed with an approximate quadrangle plane shape while having the same or about the same area, and the first openings 91 may be formed with a greater area than the second openings 93 and the third openings 95. The second opening 93 and the third opening 95 are quadrangular with longer sides extending in the x-axis direction, and the first opening 91 is quadrangular with longer sides extending in the y-axis direction.

All boundary lines of the second opening 93 and the third opening 95 are respectively positioned within the boundary lines of the second and third first electrodes 73 and 75 at a predetermined distance from the boundary lines of the second and third first electrodes 73 and 75. The boundary lines of the second opening 93 and the third opening 95 are respectively positioned apart from the boundary lines of the second and third first electrodes 73 and 75 by a distance of at least 4 μm.

The boundary lines of the first opening 91 include two pairs of boundary lines respectively facing each other, and the longer boundary lines among them are positioned within longer boundary lines of the first first electrode 71 at a predetermined distance from the longer boundary lines of the first first electrode 71. The longer boundary lines of the first opening 91 are positioned apart from the longer boundary lines of the first first electrode 71 by a distance of at least 4 μm.

The shorter boundary lines among the boundary lines of the first opening 91 overlap the shorter boundary lines of the first first electrode 71. In addition, the shorter boundary lines of the first opening 91 may be positioned outside the shorter boundary lines of the first first electrode 71 such that the shorter boundary lines of the first first electrode 71 may be exposed by the first opening 91.

Figure 2:
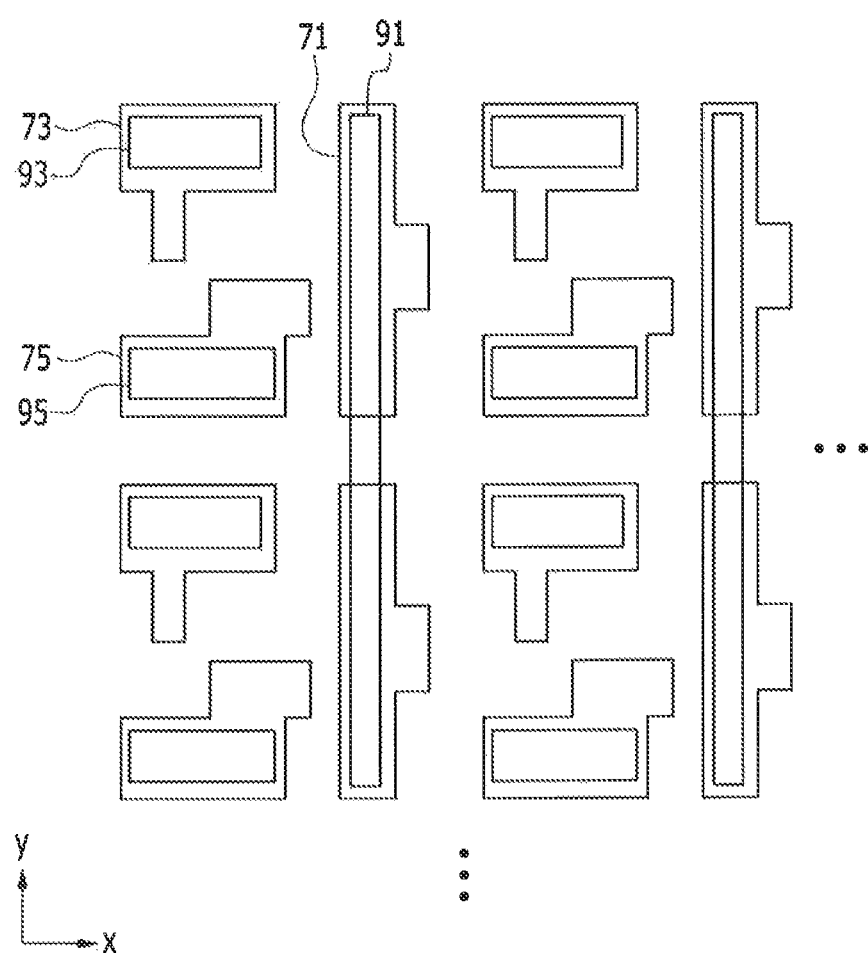
FIG. 2 is a pixel layout view of an OLED display according to an exemplary embodiment of the present invention.

FIG. 2 is a pixel layout view of an OLED display according to an exemplary embodiment of the present invention.

Most of FIG. 2 is the same as that of FIG. 1 such that differences may only be described.

All boundary lines of the second opening 93 and the third opening 95 of FIG. 2 are positioned apart from boundary lines of the second and third first electrodes 73 and 75 by a predetermined distance, and all boundary lines of the second opening 93 and the third opening 95 are positioned within the boundary lines of the second and third first electrodes 73 and 75.

The first opening 91 exposes the first first electrode 71 positioned in the column of the first opening 91. A boundary line of the first first electrode 71 is exposed by the first opening 91.

In the exemplary embodiment of FIG. 2, the first opening 91 is formed across two first first electrodes 71; however, more first first electrodes 71 may be exposed by the first opening 91 (not shown). Further, all first first electrodes 71 positioned in the same column may be exposed through one first opening 91.

According to an exemplary embodiment of the present invention, when forming the openings (e.g., 91, 93 and/or 95), a misalignment margin of a mask used to form an organic emission layer is increased such that a defect due to the misalignment may be minimized.

Next, this will be described with reference to FIG. 3 to FIG. 8.

FIG. 3 to FIG. 8 are top plan views of intermediate steps of manufacturing an OLED display according to an exemplary embodiment of the present invention.

FIG. 3 to FIG. 8 are top plan views showing a first electrode of an organic light emitting element, an opening, and a fine film mask.

Figure 3:
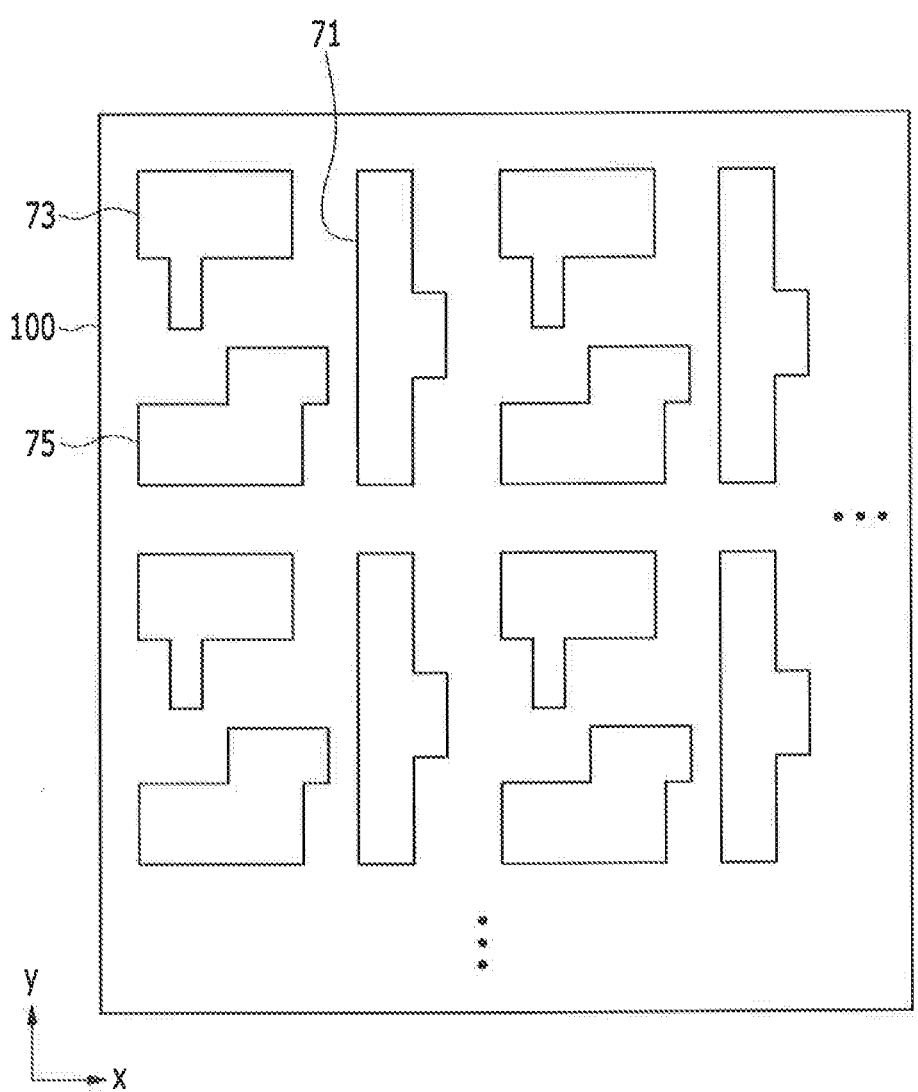
FIG. 3 to FIG. 8 are top plan views of intermediate steps of manufacturing an OLED display according to an exemplary embodiment of the present invention.

As shown in FIG. 3, a metal layer is formed on a substrate 100 and is patterned to respectively form the first, second, and third first electrodes 71, 73, and 75, respectively, at the first pixel, the second pixel, and the third pixel. The first pixel may be the blue pixel, the second pixel may be the red pixel, and the third pixel may be the green pixel.

A thin film transistor (not shown) connected to the first, second, and third first electrodes 71, 73, and 75 of each pixel is formed on the substrate 100.

The first, second, and third first electrodes 71, 73, and 75 of each pixel may have a protruding portion of various shapes depending on a connection to be made with the thin film transistor.

Figure 4:
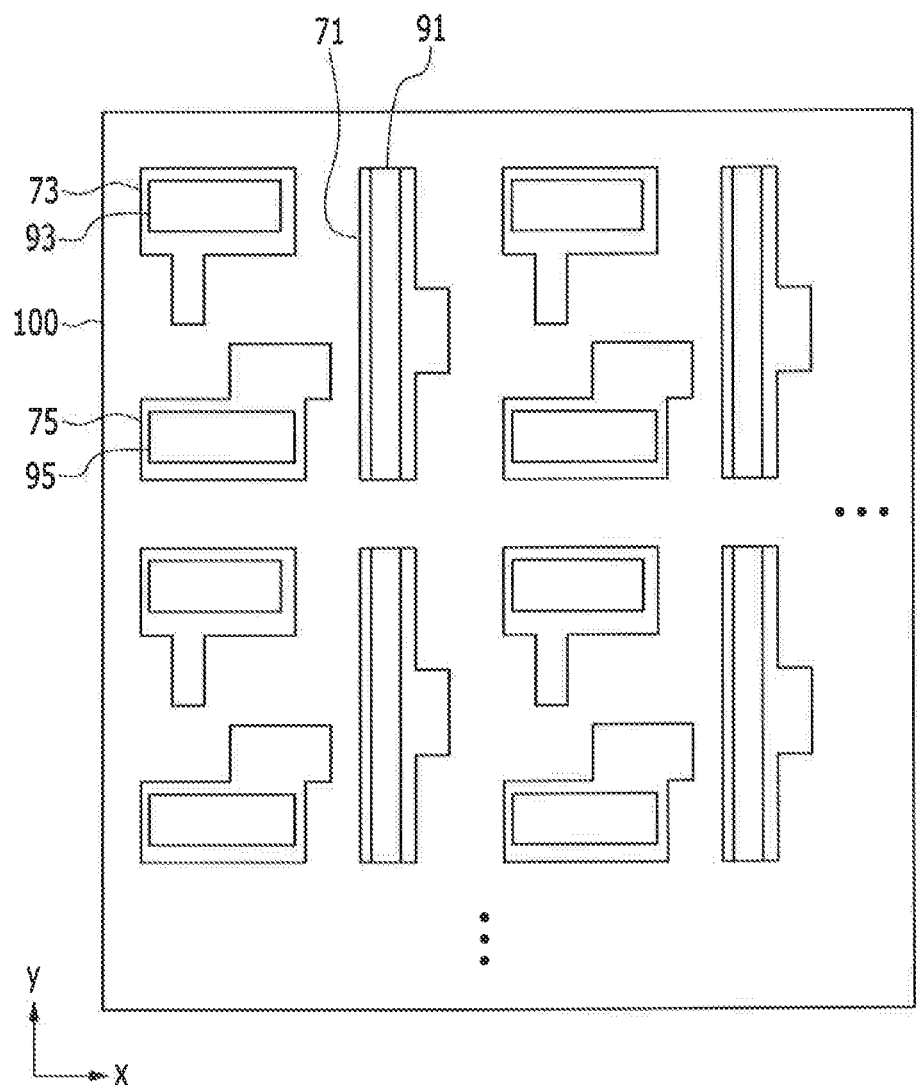

Next, as shown in FIG. 4, a pixel definition layer having the first opening 91, the second opening 93, and the third opening 95 exposing the first electrodes of each pixel is formed on the first, second, and third first electrodes 71, 73, and 75.

Figure 5:
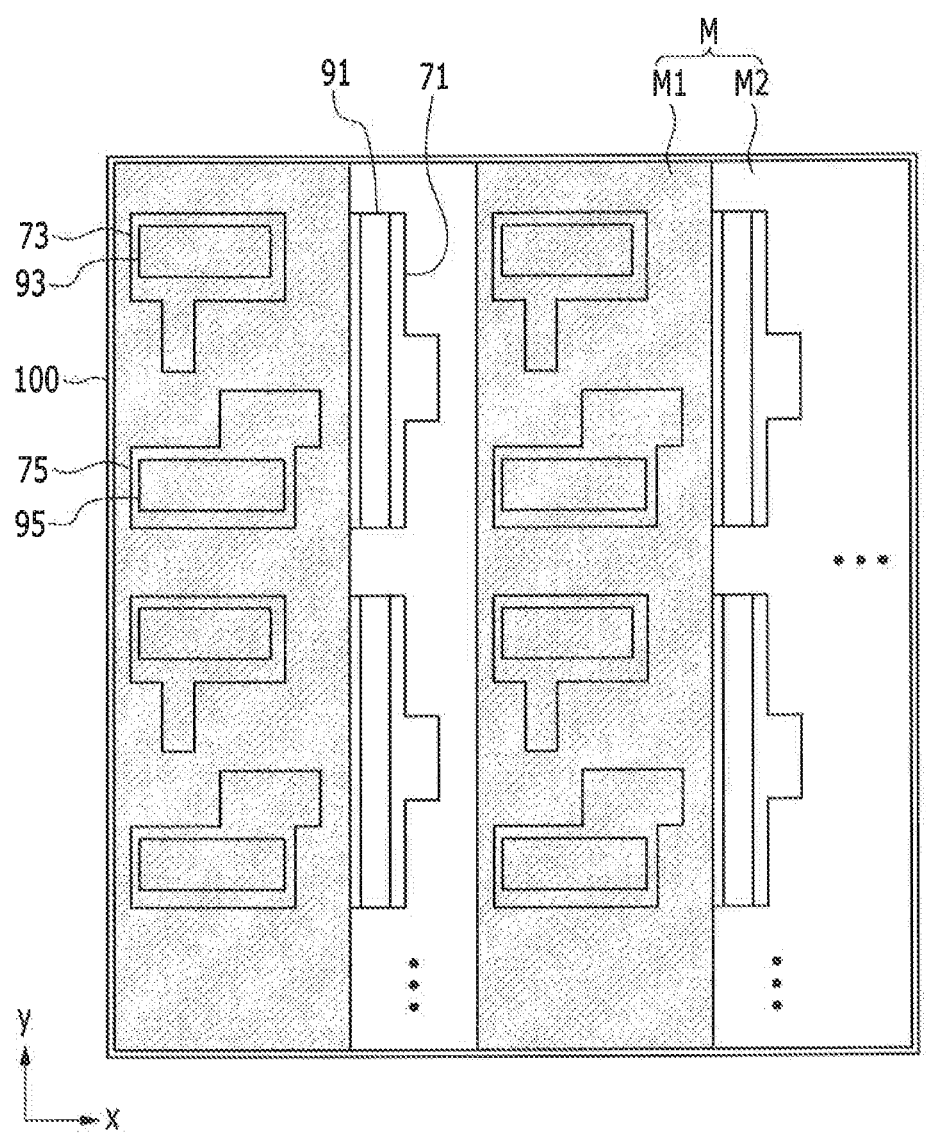

Next, as shown in FIG. 5, a mask M exposing the first opening 91 is disposed on the substrate 100 and an organic emission layer is deposited to form a blue organic emission layer at the first opening 91. For the second opening 93 and the third opening 95, the organic emission layer is deposited through the mask M by the same method described for the first opening 91 to form a red organic emission layer and a green organic emission layer, respectively.

However, when forming the organic emission layer by using the mask M, a misalignment may occur. First, an example of forming the blue organic emission layer will be described.

The mask M to form the blue organic emission layer includes a light blocking part (a gray color region, M1) covering the second pixel column and an exposure part M2 exposing the first pixel column.

After disposing the mask M on the substrate 100 while moving it in the x-axis and the y-axis directions, the mask M is aligned to correspond the second pixel column to the light blocking part M1 and the first pixel column to the exposure part M2. At this time, the first pixel column and the exposure part M2 are aligned at the proper position, however the mask M may be moved in the x-axis or the y-axis direction to be misaligned.

Figure 6:
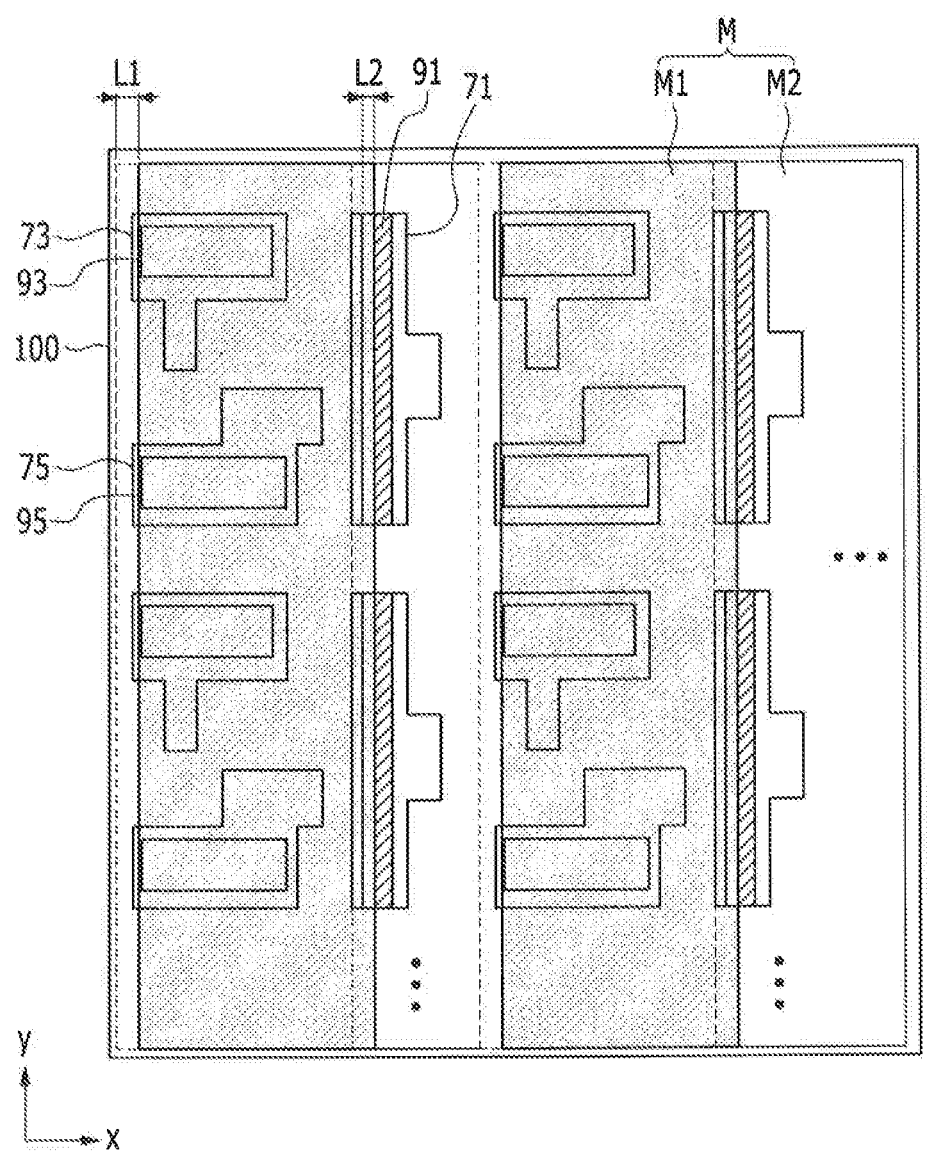

As shown in FIG. 6, if the mask M is moved in the +x-axis direction such that a misalign of a distance L1 occurs, the light blocking part M1 of the mask M may overlap the first opening 91 of the first pixel column by a distance L2 as well as the second opening 93 and the third opening 95 of the second pixel column.

When the first opening 91 is covered by the light blocking part M1, the area (a hatched region) of the exposed first opening 91 is reduced such that the area of the blue emission layer may be reduced.

Accordingly, in an exemplary embodiment of the present invention, the boundary line of the first opening 91 is positioned apart from the boundary line of the first first electrode 71 by a predetermined distance, for example, at least 4 µm, which is a greater distance than a range that the mask M may be moved when it is misaligned. In other words, if the mask M is moved like that shown in FIG. 6 and overlaps the first first electrode 71, the first opening 91 is positioned far enough away from the boundary line of the first first electrode 71 such that the light blocking part M1 of the mask M does not cover the first opening 91.

Figure 7:
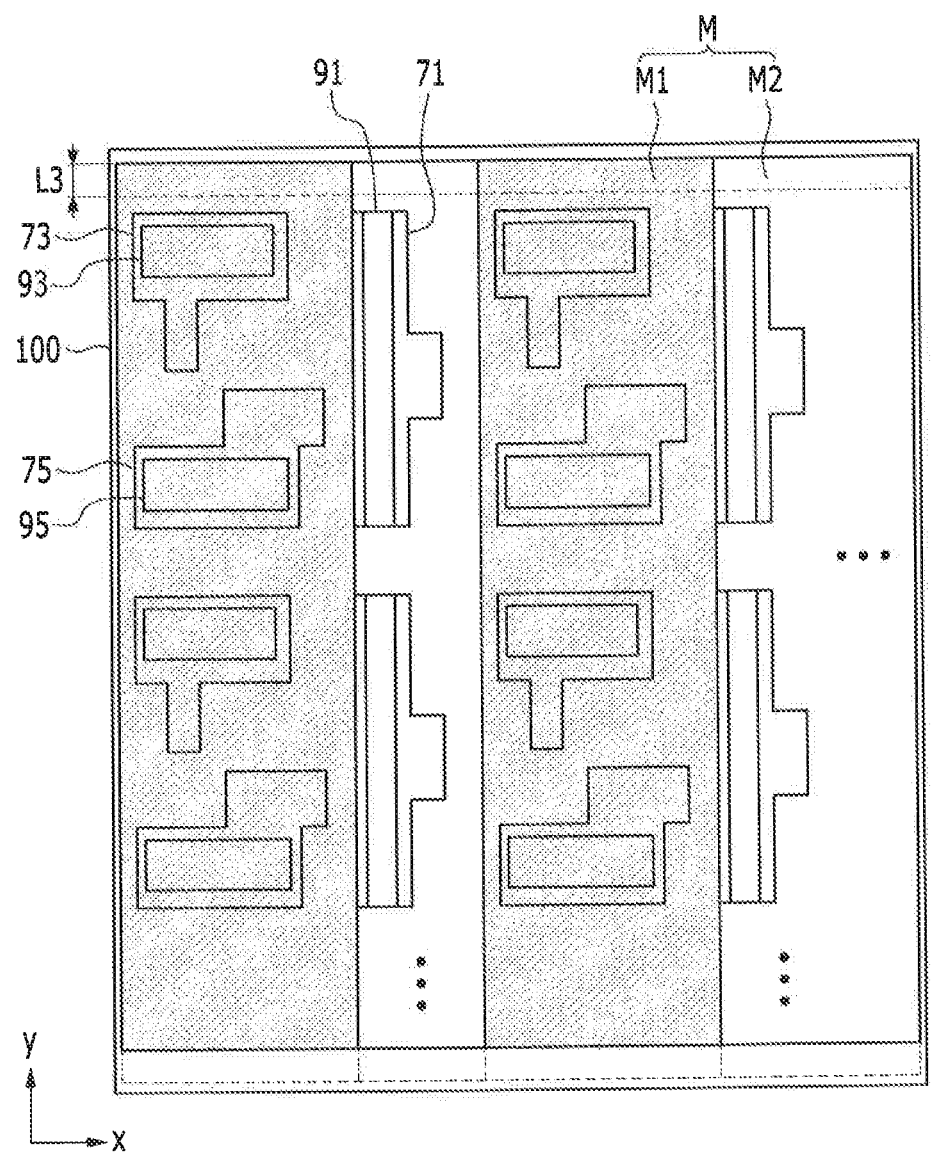

On the other hand, as shown in FIG. 7, when the mask M is moved in the y-axis direction by a distance L3, the exposure part M2 of the mask M still exposes a plurality of first openings 91 that are positioned in the first pixel column and the light blocking part M1 of the mask M does not overlap the first pixel column such that the first openings 91 are not covered by the light blocking part M1 even though the misalignment occurs in the y-axis direction.

In this way, although the misalignment takes place, the first openings 91 are not covered by the light blocking part M1 of the mask M such that the boundary lines of the first openings 91 are positioned at the same position as the boundary lines of the first first electrodes 71 like in FIG. 1, or the first openings 91 expose the boundary lines of the first first electrodes 71 as shown in FIG. 2, thereby increasing the area of the blue organic emission layer.

Since the method of forming the red organic emission layer and the green organic emission layer of the second pixel and the third pixel is substantially the same, only an example of forming the red organic emission layer of the second pixel is described.

The mask M to form the green organic emission layer of the third pixel has a light blocking part M1 blocking the first opening 91 and the second opening 93 and an exposure part M2 exposing the third opening 95 such that the mask M is moved and aligned in the x-axis and the y-axis directions for the exposure part M2 of the mask M to correspond to the third opening 95.

At this time, the exposure part M2 of the mask M is aligned at the proper position with the third opening 95, however movement of the mask M may result in it being misaligned.

Figure 8:
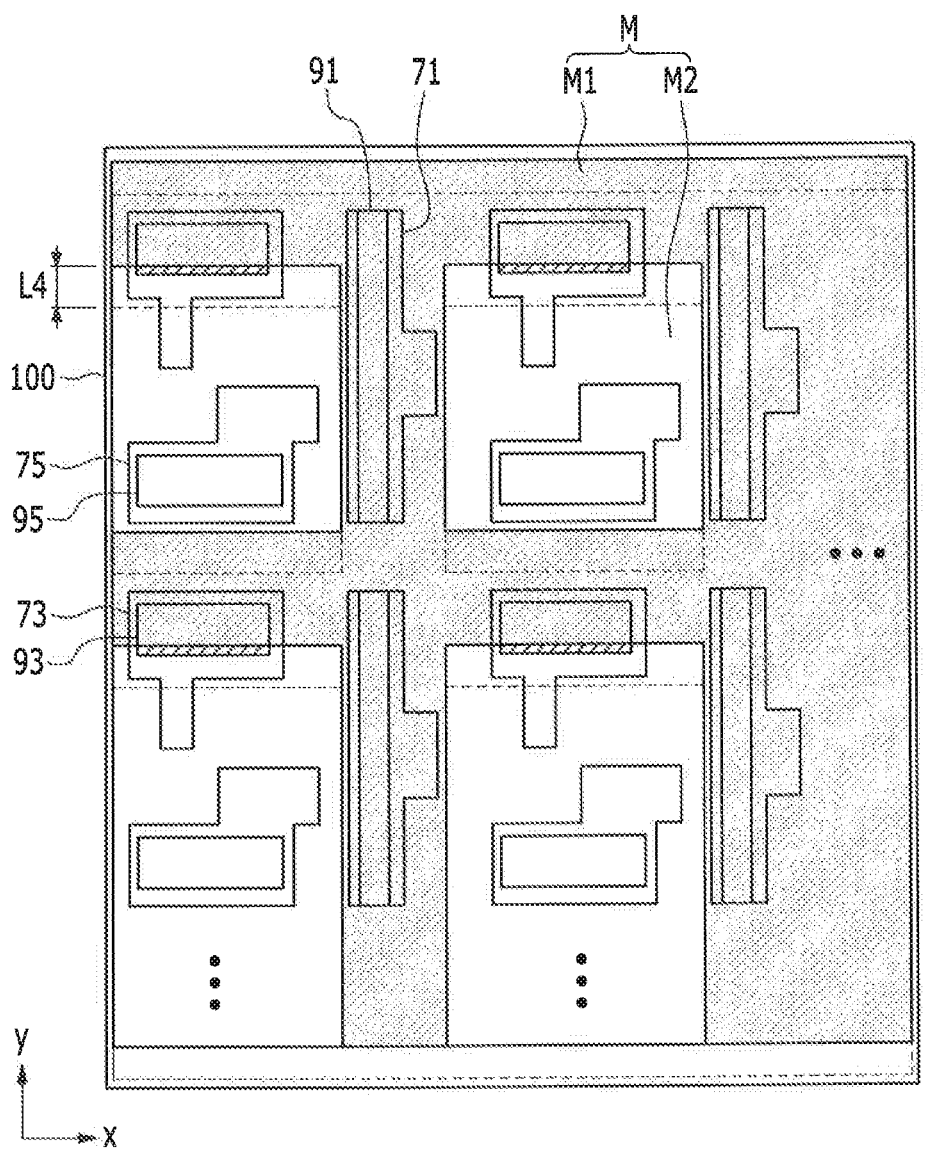

As shown in FIG. 8, if the mask M is moved in the y-axis direction and a misalignment of a distance L4 occurs, the exposure part M2 of the mask M may expose a portion (a hatched region) of the second opening 93 as well as the third opening 95.

In this way, when the second opening 93 is not covered by the light blocking part M1 of the mask M and is overlapped by the exposure part M2 of the mask M, the green organic emission layer of the third pixel is also formed at the exposed second opening 93 in addition to the third opening 95 such that the colors may mix with the light emitting color of the organic emission layer formed at the second opening 93. For example, the color green may mix with the color red.

Accordingly, in an exemplary embodiment of the present invention, the boundary line of the second opening 93 is positioned apart from the boundary line of the second electrode 73 by a predetermined distance, for example, at least 4 µm, which is a greater distance than a range that the mask M may be moved when it is misaligned. In other words, if the mask M is moved like that shown in FIG. 8, the second opening 93 is positioned far enough away from the boundary line of the second first electrode 73 such that the opening 93 is not exposed by the exposure part M2 of the mask M.

One pixel of the organic light emitting diode (OLED) display will be described in detail with reference to FIG. 9 and FIG. 10.

Figure 9:
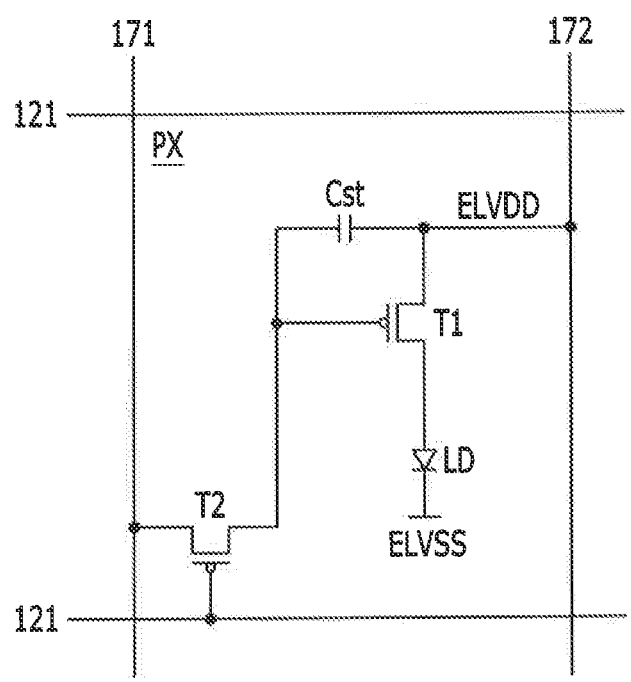
FIG. 9 is an equivalent circuit of one pixel of an OLED display according to an exemplary embodiment of the present invention.

FIG. 9 is an equivalent circuit of one pixel of an OLED display according to an exemplary embodiment of the present invention.

An OLED display according to the present exemplary embodiment includes a plurality of signal lines 121, 171, and 172, and a pixel PX connected thereto.

The signal lines include a plurality of gate lines 121 for transmitting gate signals (or scanning signals), a plurality of data lines 171 for transmitting data signals, and a plurality of driving voltage lines 172 for transmitting a driving voltage ELVDD. The gate lines 121 extend substantially in a row direction and substantially parallel to each other, and the data lines 171 extend substantially in a column direction and substantially parallel to each other. The driving voltage lines 172 extend substantially in a column direction and substantially parallel to each other, however they may extend in the row direction or the column direction, and may form a mesh shape with the data lines 171 and the gate lines 121.

One pixel PX includes a switching transistor T2, a driving transistor T1, a capacitor Cst, and an organic light emitting element LD.

The switching transistor T2 has a control terminal connected to one of the gate lines 121, an input terminal connected to one of the data lines 171, and an output terminal connected to the driving transistor T1. The switching transistor T2 transmits data signals applied to the data line 171 to the driving transistor T1 in response to a gate signal applied to the gate line 121.

The driving transistor T1 has a control terminal connected to the switching transistor T2, an input terminal connected to the driving voltage line 172, and an output terminal connected to the organic light emitting element LD. The driving transistor T1 drives an output current ILD having a magnitude depending on the voltage between its control terminal and output terminal.

The capacitor Cst is connected between the control terminal and the input terminal of the driving transistor T1. The capacitor Cst stores a data signal applied to the control terminal of the driving transistor T1 and maintains the data signal after the switching transistor T2 turns off.

The organic light emitting element LD, which may be an OLED, has an anode connected to the output terminal of the driving transistor T1 and a cathode connected to a common voltage ELVSS. The organic light emitting element LD emits light having an intensity depending on the output current ILD of the driving transistor T1, thereby displaying images. The organic light emitting element LD may include an organic material uniquely emitting at least one of three primary colors of red, green, and blue, and the OLED display displays desired images by a spatial sum thereof.

Figure 10:
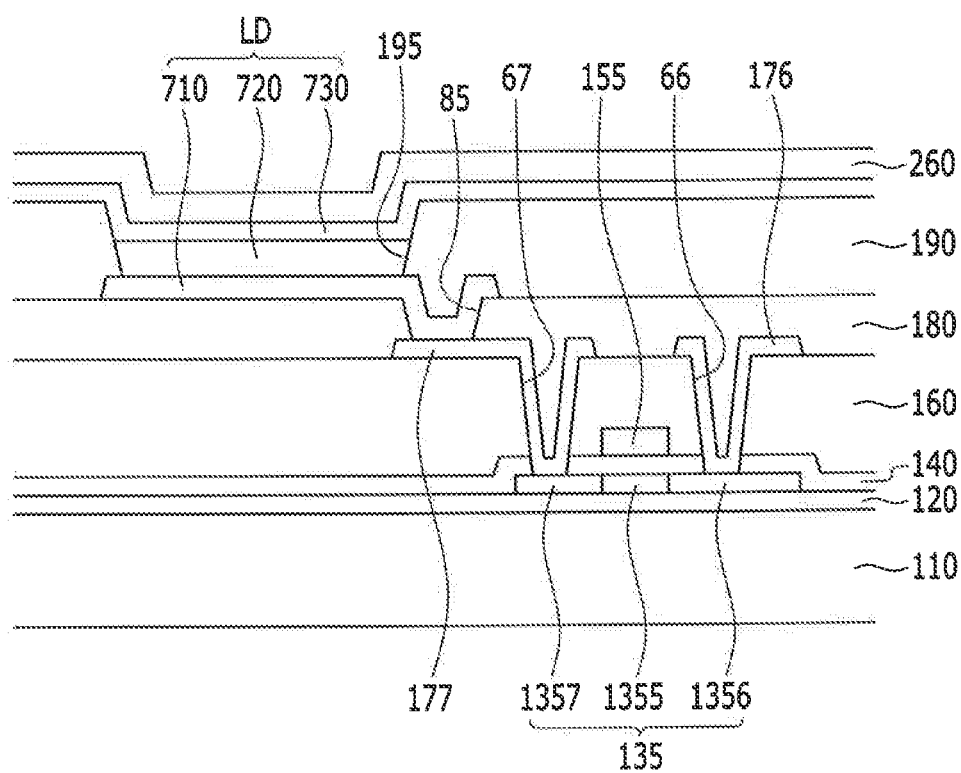
FIG. 10 is a cross-sectional view of one pixel of the OLED display of FIG. 9.

FIG. 10 is a cross-sectional view of one pixel of the OLED display of FIG. 9.

FIG. 10 illustrates the pixel according to a layer lamination order focusing on the driving transistor T1 and the organic light emitting element LD of FIG. 9. Hereafter, the driving transistor T1 is referred to as a thin film transistor.

As shown in FIG. 10, the OLED display includes a substrate 110, and a buffer layer 120 is formed on the substrate 110.

The substrate 110 may be a transparent insulating substrate made of glass, quartz, ceramic, or plastic, or a metal substrate made of stainless steel.

The buffer layer 120 may be formed of a single SiNx layer or a double layer of SiNx and SiO2. The buffer layer 120 prevents unnecessary components such as impurities or moisture from infiltrating into the substrate 110, and planarizes the surface of the substrate 110.

A semiconductor layer 135 is formed of polysilicon on the buffer layer 120.

The semiconductor layer 135 may be formed of a polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 135 is formed of the oxide semiconductor, a separate protective layer may be added to protect the oxide semiconductor that is weak with regard to an external environment such as high temperatures.

The semiconductor layer 135 is divided into a channel region 1355, and a source region 1356 and a drain region 1357 formed on respective sides of the channel region 1355. The channel region 1355 of the semiconductor layer 135 is made of undoped polysilicon, in other words, an intrinsic semiconductor. The source region 1356 and the drain region 1357 are made of polysilicon doped with a conductive impurity, in other words, an impurity semiconductor. The impurity doped into the source region 1356 and the drain region 1357 may be a p-type impurity or an n-type impurity.

A gate insulating layer 140 is formed on the semiconductor layer 135. The gate insulating layer 140 may be a single layer or a multi-layer including at least one of tetraethyl orthosilicate (TEOS), silicon nitride, and a silicon oxide.

A gate electrode 155 is formed on the semiconductor layer 135 and overlaps the channel region 1355.

The gate electrode 155 may be formed of a single layer or multiple layers of a low resistance material or a highly corrosion-resistant material such as Al, Ti, Mo, Cu, Ni, and alloys thereof.

A first interlayer insulating layer 160 is formed on the gate electrode 155. The first interlayer insulating layer 160 may be formed of a single layer or multiple layers including at least one of TEOS, silicon nitride, and a silicon oxide, like the gate insulating layer 140.

The first interlayer insulating layer 160 and the gate insulating layer 140 have a source contact hole 66 and a drain contact hole 67 which respectively expose the source region 1356 and the drain region 1357.

A source electrode 176 and a drain electrode 177 are formed on the first interlayer insulating layer 160. The source electrode 176 is connected to the source region 1356 through the source contact hole 66, and the drain electrode 177 is connected to the drain region 1357 through the drain contact hole 67.

The source electrode 176 and the drain electrode 177 may be made of single or multiple layers of a low resistance material or a highly corrosion-resistant material such as Al, Ti, Mo, Cu, Ni, and alloys thereof. For example, the source electrode 176 and drain electrode 177 can be formed of three-level layers of Ti/Cu/Ti, Ti/Ag/Ti, or Mo/Al/Mo.

The gate electrode 155, the source electrode 176, and the drain electrode 177 respectively correspond to the control terminal, the input terminal, and the output terminal shown in FIG. 9, and form the thin film transistor along with the semiconductor layer 135. A channel of the thin film transistor is formed in a portion of the semiconductor layer 135, which is disposed between the source electrode 176 and the drain electrode 177.

A second interlayer insulating layer 180 is formed on the source electrode 176 and the drain electrode 177. The second interlayer insulating layer 180 includes a contact hole 85 exposing the drain electrode 177.

The second interlayer insulating layer 180 may be formed of a single layer or multiple layers of at least one of TEOS, silicon nitride, and a silicon oxide, or may be formed of a low dielectric constant organic material, like the first interlayer insulating layer 160.

A first electrode 710 is formed on the second interlayer insulating layer 180. The first electrode 710 is electrically connected to the drain electrode 177 through the contact hole 85 and may be the anode of the organic light emitting element LD of FIG. 9.

While the second interlayer insulating layer 180 is formed between the first electrode 710 and the drain electrode 177 in the present exemplary embodiment, the first electrode 710 can be formed at the same level as the drain electrode 177 and may be integrated with the drain electrode 177.

The first electrode 710 may be formed to have a protruding portion of various shapes to be connected to the drain electrode 177, as shown by the protruding parts in FIG. 1 and FIG. 2.

A pixel definition layer 190 is formed on the first electrode 710.

The pixel definition layer 190 has an opening 195 exposing the first electrode 710. The pixel definition layer 190 may be formed of a resin such as a polyacrylate or a polyimide resin, or of an inorganic material such as silica.

The opening 195 may be formed with various shapes according to each pixel, and the boundary line of the opening 195 may be positioned apart from the boundary line of the first electrode 710 by at least 4 µm. When one column of the pixels forming the column emit light of the same color, as shown in FIG. 1 and FIG. 2, the boundary line of the opening 195 overlaps the boundary line of the first electrode 710 or the opening 195 may be formed to expose the boundary line of the first electrode 710.

An organic emission layer 720 is formed in the opening 195 of the pixel definition layer 190.

The organic emission layer 720 is formed of multiple layers including an emission layer and one or more of a hole injection layer (HIL), a hole transport layer (HTL), an electron transport layer (ETL), and an electron injection layer (EIL).

In the case where the organic emission layer 720 includes all of the aforementioned layers, the HIL may be disposed on the first electrode 710 that is the anode, and the HTL, the emission layer, the ETL, and the EIL may be sequentially laminated thereon.

A second electrode 730 is formed on the pixel definition layer 190 and the organic emission layer 720.

The second electrode 730 becomes a cathode of the organic light emitting element LD. Accordingly, the first electrode 710, the organic emission layer 720, and the second electrode 730 form the organic light emitting element LD.

The organic light emitting element LD can be of one of a front display type, a rear display type, and a dual-sided display type according to the direction in which the organic light emitting element LD emits light.

In the case of the front display type, the first electrode 710 is formed of a reflective layer and the second electrode 730 is formed of a transflective or transmissive layer. In the case of the rear display type, the first electrode 710 is formed of a transflective layer and the second electrode 730 is formed of a reflective layer. In the case of the dual-sided display type, the first electrode 710 and the second electrode 730 are formed of a transparent layer or a transflective layer.

The reflective layer and the semi-transparent layer are made of at least one of Mg, Ag, Au, Ca, Li, Cr, and Al, or an alloy thereof. The reflective layer and the transflective layer are determined by the thicknesses thereof, and the transflective layer may have a thickness of less than 200 nm. While the transmittance of the reflective layer or transflective layer increases as the thickness thereof decreases, the resistance thereof increases when the layer is excessively thin.

The transmissive layer is made of indium tin oxide (ITO), indium zinc oxide (IZO), zinc oxide (ZnO), or indium oxide ($In_2O_3$).

An encapsulation member 260 is formed on the second electrode 730.

The encapsulation member 260 may be formed in plural by alternately forming at least one organic layer and at least one inorganic layer.

The organic layer is formed of a polymer, and it may be a single layer or a deposition layer including one of polyethylene terephthalate, a polyimide, a polycarbonate, an epoxy, polyethylene, and a polyacrylate. Further, the organic layer can be formed with a polyacrylate, and in detail, it includes a polymerized monomer composition including a diacrylate monomer and triacrylate monomer. A monoacrylate monomer can be included in the monomer composition. A photoinitiator such as TPO can be further included in the monomer composition, but the monomer composition is not limited thereto.

The inorganic layer can be a single layer or a deposition layer including a metal oxide or a metal nitride. In detail, the inorganic layer can include one of $SiN_x$, $Al_2O_3$, $SiO_2$, and $TiO_2$.

The externally exposed uppermost layer of the encapsulation layer 260 can be formed with an inorganic layer to prevent permeation of vapor into the organic light emitting element LD.

Figure 11:
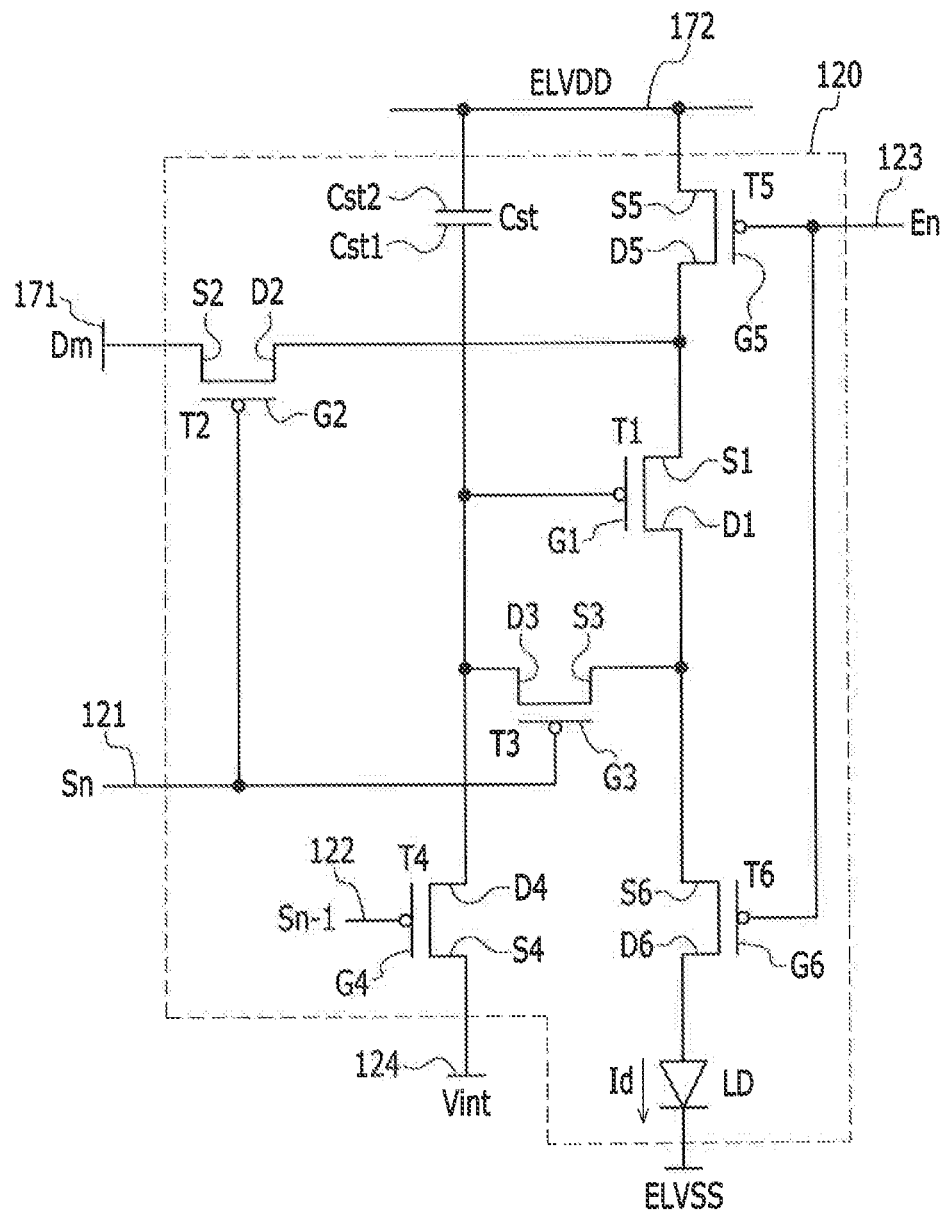
FIG. 11 is an equivalent circuit of one pixel of an OLED display according to an exemplary embodiment of the present invention.

FIG. 11 is an equivalent circuit of one pixel of an OLED display according to an exemplary embodiment of the present invention.

As shown in FIG. 11, one pixel area of an OLED display according to an exemplary embodiment of the present invention includes a plurality of signal lines 121, 122, 123, 124, 171, and 172, a plurality of transistors T1, T2, T3, T4, T5, and T6 connected to the plurality of signal lines, a storage capacitor Cst, and an organic light emitting element LD.

The transistors include a driving thin film transistor, a switching thin film transistor, a compensation transistor, an initialization transistor, an operation control transistor, and a light emission control transistor.

For better understanding and ease of description, the driving transistor is referred to as the first transistor T1, the switching transistor is referred to as the second transistor T2, the compensation transistor is referred to as the third transistor T3, the initialization transistor is referred to as the fourth transistor T4, the operation control transistor is referred to as the fifth transistor T5, and the light emission control transistor is referred to as the sixth transistor T6.

The signal lines include a gate line 121 for transferring a scan signal Sn, a prior gate line 122 for transferring a prior scan signal Sn−1 to the fourth transistor T4, a light emission control line 123 for transferring a light emission control signal En to the fifth transistor T5 and the sixth transistor T6, a data line 171 crossing the gate line 121 and transferring a data signal Dm, a driving voltage line 172 for transferring a driving voltage ELVDD and formed almost parallel to the data line 171, and an initialization voltage line 124 for transferring an initialization voltage Vint initializing the first transistor T1.

A first gate electrode G1 of the first transistor T1 is connected to an end Cst1 of the storage capacitor Cst, a first source electrode S1 of the first transistor T1 is connected via the fifth transistor T5 to the driving voltage line 172, and a first drain electrode D1 of the first transistor T1 is electrically connected via the sixth transistor T6 to an anode of the organic light emitting element LD. The first transistor T1 receives the data signal Dm according to a switching operation of the second transistor T2 to supply a driving current Id to the organic light emitting element LD. A second gate electrode G2 of the second transistor T2 is connected to the gate line 121, a second source electrode S2 of the second transistor T2 is connected to the data line 171, and a second drain electrode D2 of the second transistor T2 is connected to the first source electrode S1 of the first transistor T1 and to the driving voltage line 172 via the fifth transistor T5. The second transistor T2 is turned on according to the scan signal Sn transferred through the gate line 121 to perform a switching operation of transferring the data signal Dm transferred to the data line 171 to the first source electrode S1 of the first transistor T1.

A third gate electrode G3 of the third transistor T3 is connected to the gate line 121, and a third source electrode S3 of the third transistor T3 is connected to the first drain electrode D1 of the first transistor T1 and to the anode of the organic light emitting element LD via the sixth transistor T6. A third drain electrode D3 of the third transistor T3 is connected to one end Cst1 of the storage capacitor Cst, a fourth drain electrode D4 of the fourth transistor T4, and the first gate electrode G1 of the first transistor T1. The third transistor T3 is turned on according to the scan signal Sn transmitted through the gate line 121 to connect the gate electrode G1 and the drain electrode D1 of the first transistor T1 to each other, thus performing diode-connection of the first transistor T1.

A fourth gate electrode G4 of the fourth transistor T4 is connected to the prior gate line 122, a fourth source electrode S4 of the fourth transistor T4 is connected to the initialization voltage line 124, and the fourth drain electrode D4 of the fourth transistor T4 is connected to one end Cst1 of the storage capacitor Cst, the third drain electrode D3 of the third transistor T3, and the first gate electrode G1 of the first transistor T1. The fourth transistor T4 is turned on according to the prior scan signal Sn−1 transferred through the prior scan line 122 to transfer the initialization voltage Vint to the gate electrode G1 of the first transistor T1, thus performing an initialization operation for initializing the voltage of the gate electrode G1 of the first transistor T1.

A fifth gate electrode G5 of the fifth transistor T5 is connected to the light emission control line 123, a fifth source electrode S5 of the fifth transistor T5 is connected to the driving voltage line 172, and a fifth drain electrode D5 of the fifth transistor T5 is connected to the first source electrode S1 of the first transistor T1 and the second drain electrode D2 of the second transistor T2.

A sixth gate electrode G6 of the sixth transistor T6 is connected to the light emission control line 123, a sixth source electrode S6 of the sixth transistor T6 is connected to the first drain electrode D1 of the first transistor T1 and the third source electrode S3 of the third transistor T3, and a sixth drain electrode D6 of the sixth transistor T6 is electrically connected to the anode of the organic light emitting element LD. The fifth transistor T5 and the sixth transistor T6 are simultaneously turned on according to the light emission control signal En transferred through the light emission control line 123 to transfer the driving voltage ELVDD to the organic light emitting element LD, thus allowing the driving current Id to flow in the organic light emitting element LD.

The other end Cst2 of the storage capacitor Cst is connected to the driving voltage line 172, and the cathode of the organic light emitting element LD is connected to the common voltage ELVSS. Accordingly, the organic light emitting element LD receives the driving current Id from the driving transistor T1 to emit light, thereby displaying an image.

In this pixel circuit, the first transistor T1 charges a voltage corresponding to the data signal Dm to the storage capacitor Cst according to the scan signal Sn, and a current corresponding to the voltage charged to the storage capacitor Cst is provided to the organic light emitting element LD. In this case, since a threshold voltage of the first transistor T1 may vary as time passes, the third transistor T3 diode-connects the first transistor T1 in response to the scan signal Sn so that the threshold voltage Vth is compensated.

Now, the operation of one pixel circuit of the OLED display according to an exemplary embodiment of the present invention, as shown in FIG. 11, will be described in detail.

First, the prior scan signal Sn−1 of a low level is supplied through the prior gate line 122 during an initialization period. Then, the fourth transistor T4 is turned on corresponding to the prior scan signal Sn−1 of the low level, and the initialization voltage Vint is provided from the initialization voltage line 124 through the fourth transistor T4 to the first gate electrode G1 of the first transistor T1 to initialize the first transistor T1 with the initialization voltage Vint.

Subsequently, the scan signal Sn of the low level is supplied through the gate line 121 during a data programming period. The second transistor T2 and the third transistor T3 are turned on corresponding to the scan signal Sn of the low level.

In this case, the first transistor T1 is diode-connected by the turned-on third transistor T3, and is biased in a forward direction.

A compensation voltage Dm+Vth (Vth is a negative value) obtained by subtracting a threshold voltage Vth of the first transistor T1 from the data signal Dm supplied from the data line 171 is then applied to the first gate electrode G1 of the first transistor T1.

The driving voltage ELVDD and the compensation voltage Dm+Vth are applied to both ends Cst1 and Cst2 of the storage capacitor Cst, and a charge corresponding to a difference between voltages at both ends Cst1 and Cst2 is stored in the storage capacitor Cst. Thereafter, the level of the light emission control signal En supplied from the light emission control line 123 during the light emission period is changed from the high level to the low level. The fifth transistor T5 and the sixth transistor T6 are then turned on by the light emission control signal En of the low level during the light emission period.

Subsequently, the driving current Id is generated according to a difference between the voltage of the first gate electrode G1 of the first transistor T1 and the driving voltage ELVDD, and the driving current Id is supplied through the sixth transistor T6 to the organic light emitting element LD. A gate-source voltage Vgs of the first transistor T1 is maintained at (Dm+Vth)−ELVDD by the storage capacitor Cst during the light emission period, and the driving current Id is proportional to a square of a value obtained by subtracting the threshold voltage from a source-gate voltage, in other words, $(Dm-ELVDD)^2$, according to a current-voltage relationship of the first transistor T1. Accordingly, the driving current Id is determined regardless of the threshold voltage Vth of the first transistor T1.

According to an exemplary embodiment of the present invention, if a misalignment of openings of a mask and electrodes occurs, the area of an emission layer is not reduced and color mixing is prevented, thereby providing an OLED display of high quality and long life.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode (OLED) display, comprising:
    a substrate;
    a plurality of thin film transistors formed on the substrate;
    a plurality of first electrodes respectively connected to the thin film transistors;
    a pixel definition layer formed on the substrate and having a first opening, a second opening, and a third opening respectively exposing first, second, and third first electrodes of the plurality of first electrodes;
    an emission layer formed at the first opening, the second opening, and the third opening; and
    a second electrode formed on the emission layer,
    wherein the first opening has a first pair of boundary lines facing each other and a second pair of boundary lines facing each other,
    the first pair of boundary lines are coincident with boundary lines of a pair of boundary lines of the first first electrode, and the second pair of boundary lines are positioned within another pair of boundary lines of the first first electrode, and
    the first pair of boundary lines are connected with the second pair of boundary lines.

2. The OLED display of claim 1, wherein the second pair of boundary lines of the first opening is positioned apart from another pair of boundary lines of the first first electrode by at least 4 µm.

3. The OLED display of claim 1, wherein boundary lines of the second and third openings are respectively positioned within boundary lines of the second and third first electrodes.

4. The OLED display of claim 3, wherein the boundary lines of the second and third openings are positioned apart from the boundary lines of the second and third first electrodes by at least 4 µm.

5. The OLED display of claim 1, wherein:
    the emission layer includes a first emission layer, a second emission layer, and a third emission layer respectively positioned on the first, second, and third first electrodes; and
    the first emission layer, the second emission layer, and the third emission layer are respectively positioned in the first, second, and third openings.

6. The OLED display of claim 5, wherein the first emission layer, the second emission layer, and the third emission layer emit light of different colors.

7. The OLED display of claim 6, wherein the first emission layer, the second emission layer, and the third emission layer are respectively a blue emission layer, a red emission layer, and a green emission layer.

8. The OLED display of claim 5, wherein a plurality of the first, second and third emission layers form columns and rows, and
    the columns include a first column formed of the first emission layers and a second column formed of the second emission layers and the third emission layers.

9. The OLED display of claim 8, wherein the first column and the second column are alternately repeated.

10. The OLED display of claim 9, wherein the second emission layer and the third emission layer are alternately positioned in the second column.

11. An organic light emitting diode (OLED) display, comprising:
    a substrate;
    a plurality of thin film transistors formed on the substrate;
    a plurality of first electrodes respectively connected to the thin film transistors;
    a pixel definition layer formed on the substrate and having a first opening, a second opening, and a third opening respectively exposing first, second, and third first electrodes of the plurality of first electrodes;
    an emission layer formed in the first opening, the second opening, and the third opening; and
    a second electrode formed on the emission layer,
    wherein the first opening has a connected boundary line which has a portion coincident with a boundary line of the first first electrode and a portion positioned within the boundary line of the first first electrode, and
    the second and third openings respectively have a boundary entirely positioned within the boundary of the second and third first electrodes.

12. The OLED display of claim 11, wherein:
    the emission layer includes a first emission layer, a second emission layer, and a third emission layer for emitting different colors, and
    the first emission layer, the second emission layer, and the third emission layer are respectively positioned in the first, second, and third openings.

13. The OLED display of claim 12, wherein the first emission layer, the second emission layer, and the third emission layer are respectively a blue emission layer, a red emission layer, and a green emission layer.

14. The OLED display of claim 12, wherein a plurality of the first, second and third emission layers form columns and rows, and the columns include a first column formed of the first emission layers, and a second column formed of the second emission layers and the third emission layers.

15. The OLED display of claim 14, wherein the first column and the second column are alternately repeated.

16. The OLED display of claim 15, wherein the second emission layer and the third emission layer are alternately positioned in the second column.

17. An organic light emitting diode (OLED) display, comprising:

a substrate;

a pixel electrode and formed on the substrate; and a pixel definition layer having an opening exposing the pixel electrode, wherein the opening has a connected boundary line, a portion of the connected boundary line is coincident with a boundary line of the pixel electrode, and another portion of the connected boundary line is positioned within the boundary line of the pixel electrode.

\* \* \* \* \*